United States Patent [19]

Booth et al.

[11] Patent Number: 5,545,429
[45] Date of Patent: Aug. 13, 1996

[54] FABRICATION OF DOUBLE SIDE FULLY METALLIZED PLATED THRU-HOLES, IN POLYMER STRUCTURES, WITHOUT SEEDING OR PHOTOPROCESS

[75] Inventors: Richard B. Booth, Pfugerville, Tex.; Emanuel I. Cooper, Riverdale, N.Y.; Edward A. Giess, Mooresville, N.C.; Mark R. Kordus, Ninety-Six, both of S.C.; Sol Krongelb, Katonah, N.Y.; Steven P. Ostrander, Scotia, N.Y.; Judith M. Roldan, Ossining, N.Y.; Carlos J. Sambucetti, Croton-on-Hudson, N.Y.; Ravi Saraf, Briarcliff Manor, N.Y.

[73] Assignee: International Business Machines Corporation, Armonk, N.Y.

[21] Appl. No.: 270,086

[22] Filed: Jul. 1, 1994

[51] Int. Cl.⁶ .................................. B05D 5/12; C25D 5/02
[52] U.S. Cl. .......................... 427/97; 427/96; 427/98; 427/437; 205/125; 205/133; 205/183; 205/80; 156/150
[58] Field of Search ............................ 427/96, 97, 98, 427/437; 205/125, 123, 133, 80, 158, 183; 156/150, 153

[56] References Cited

U.S. PATENT DOCUMENTS

| | | | |
|---|---|---|---|
| 3,011,920 | 12/1961 | Shipley, Jr. | 117/213 |
| 3,385,773 | 5/1968 | Frantzen | 204/16 |
| 3,532,518 | 10/1970 | D'Ottavio | 106/1 |
| 3,536,594 | 10/1970 | Pritchard | 205/133 |
| 3,865,699 | 2/1975 | Luch | 205/158 |
| 3,877,983 | 4/1975 | Hovsepian | 136/6 LN |
| 4,033,833 | 7/1977 | Bestel et al. | 204/15 |
| 4,396,467 | 8/1983 | Anthony | 204/15 |
| 4,401,521 | 8/1983 | Ohmura et al. | 156/150 |
| 4,915,795 | 4/1990 | McKiel, Jr. et al. | 204/15 |
| 4,969,979 | 11/1990 | Appelt et al. | 204/15 |
| 4,976,990 | 12/1990 | Bach et al. | 427/98 |
| 5,132,038 | 7/1992 | Kukanskis et al. | 252/139 |

FOREIGN PATENT DOCUMENTS 0026694  2/1985  Japan ..................................... 205/158

*Primary Examiner*—Shrive Beck
*Assistant Examiner*—Brian K. Talbot
*Attorney, Agent, or Firm*—Scully, Scott, Murphy & Presser

[57] ABSTRACT

The present invention is directed to a process of a method for the full metallization of thru-holes in a polymer structure comprising the steps of applying a film-forming amount of a conductive polymer-metal composite paste to a metal cathode; bonding a patterned polymer structure to said paste; subjecting said polymer structure to an electrolytic plating bath for a time sufficient to fully metallize thru-hole surfaces in said patterned polymer structure and removing the structure from the cathode assembly. The fully metallized thru-hole polymer structure can then be cleaned and polished to produce a finished product.

47 Claims, 2 Drawing Sheets

FABRICATION OF DOUBLE SIDE FULLY METALLIZED PLATED THRU-HOLES, IN POLYMER STRUCTURES, WITHOUT SEEDING OR PHOTOPROCESS

TECHNICAL FIELD

The present invention is generally related to the field of semiconductors and circuit board manufacturing techniques. More specifically, the present invention is directed to a technique for the fabrication of double side fully metallized plated thru-holes in polymer structures. The metallization technique in accordance with the present invention does not include the step of activation or seeding, nor does it involve any photoprocessing steps. Particularly, the metallization technique of the present invention can be used in the manufacturing of polymer interposers for chip testing, as well as for the fabrication of multiple layer polyimide structures for mounting and interconnecting electronic system components.

PRIOR ART

The techniques of metallization of non-conductive surfaces play a vital role in the manufacture of printed circuit boards wherein metallization is used to provide patterned, conductive circuitry on non-conductive substrate materials. It has become commonplace in the semiconductor field to provide circuit boards having more than one plane or layer of circuitry, wherein the layers of circuitry are separated one from the other by an insulating substrate material, i.e., a dielectric. In the simplest version of such a printed circuit board, conductive circuit patterns are provided on both sides of an insulating substrate material. In somewhat more complex versions which have become extremely popular over the past several years, a so-called multilayer circuit board is provided. These multilayer boards are comprised of one or more inner layers of conductive circuitry in addition to the layers of circuitry on the outer-facing surfaces of the board, with insulating substrate material separating each layer or inner layer of circuitry.

In order to provide conductive interconnection between or among the circuitry layers and/or inner layers in printed circuit boards, one or more vias or through-holes (also referred to as thru-holes) are formed in the board. The thru-holes, as their name suggests, are holes which go completely through the circuit board. The thru-holes are formed normal to the plane of the board and the wall surfaces thereof are then metallized.

As the metallized thru-holes provide the means for conductive interconnection between or among the circuitry layers and/or inner layers, the quality of the metal layer provided on the thru-hole surface is extremely important. In particular, it is necessary that the metal deposit adhere tightly to the thru-hole surfaces and that the metal deposit be in the form of an essentially continuous, void-free, layer. While it is true to a degree that these quality parameters are dependent upon the nature of the metal depositing solution employed and the conditions under which the metallization process is carried out, the parameters are, to a more significant degree, dependent upon the receptivity of the thru-hole surfaces to acceptance of the metal layer.

As is well known in the art, electroless deposition of metal onto non-conductive surfaces requires that a material catalytic to the electroless depositing reaction be present on the non-conductive surfaces. Numerous techniques and proposals exist in the art for treating or conditioning thru-hole surfaces so as to enhance their receptivity to the deposit of catalytic species and to the subsequently applied electroless metal deposit so as to obtain an adherent, void-free metal coating effective to provide the desired conductive interconnection between or among circuitry layers on or in the circuit board.

In the typical processes relevant to printed circuit board manufacture, wherein thru-hole metallization with copper or nickel is employed, the catalytic material generally comprises palladium metal. The process of applying catalytic material to the substrate surfaces, known generally as "activation", most typically involves contact of the substrate with a true or colloidal solution of palladium (as well as tin) compounds (generally chlorides) as described, for example, in U.S. Pat. Nos. 3,011,920 to Shipley, Jr. and 3,532,518 to D'Ottavio. That is, the inner walls of the thru-holes are activated by means of a "seeding process" which deposits a layer of palladium metal on the walls. It is generally believed that tin compounds act as protective colloids for the catalytic palladium. In many cases, the activation step is followed by an "acceleration" step which serves in some manner to expose (or increase exposure of) the active catalytic species. In any event, subsequent to the provision of the catalyst on the non-conductive surfaces of the board, the surfaces are then contacted with an electroless metal (copper or nickel) depositing bath, in which catalyzed chemical reduction reactions lead to the deposition of metal from the bath onto the catalyzed surfaces.

In addition to the manufacturing of circuit boards, metallization of thru-hole polymer structures is a key factor in the manufacturing of multiple via chip testing vehicles. As would be expected, there exists a very important need in the semiconductor field for the dynamic, electrical testing of electronic chips. In many cases, the electronic chips to be tested are at the wafer level. Accordingly, due to the enormous density of circuits in the chips, a testing system is required which is able to provide a corresponding huge number of circuit paths and interconnections. Multiple via chip testing vehicles are used for this purpose and generally consist of a polymer body with metallized thru-holes linking the top and bottom sides of the structure. In order to test an electronic chip performance and not be in danger of losing signal integrity, the testing vehicle preferably should provide a medium of low dielectric constant, i.e., lower than cordierite. To accomplish this, the testing vehicles can be made in a body of polymers such as teflon, polyimide and the like. These materials are non-conductors. Alternatively, the testing vehicles may also be fabricated with the use of ceramic materials, such as glass ceramic. However, this latter method is much more complex, lengthy and very expensive due to the inherent difficulty for processing ceramic materials.

It is therefore desired to achieve a simple and easy method of fabrication of testing vehicles, said method involving the process of metallizing thru-holes, which process can also be used in the manufacturing of printed circuit boards.

SUMMARY OF THE INVENTION

The present invention relates to a process which allows for the creation of double side fully metallized thru-holes in any polymer structures, with surface pads isolated from each other and without the need of masking or photoprocessing steps. Further, the process in accordance with the present invention does not require an activation or seeding process to begin the metallization process.

More particularly, the present invention is directed to a metallization process comprising the steps of applying a temporary removable cathode to a metal cathode to form a cathode assembly, bonding a patterned polymer structure to the temporary removable cathode, subjecting the polymer structure to an electrolytic plating bath for a time sufficient to fully metallize the thru-hole surfaces in the patterned polymer structure and removing the structure from the cathode assembly. The fully metallized plated thru-hole polymer structure can then be cleaned and polished to produce a finished product. It is preferred that the process of the present invention employ a film-forming amount of a conductive polymer-metal composite paste as the temporary removable cathode.

DETAILED DESCRIPTION OF THE PREFERRED EMBODIMENT OF THE INVENTION

Figure 1:
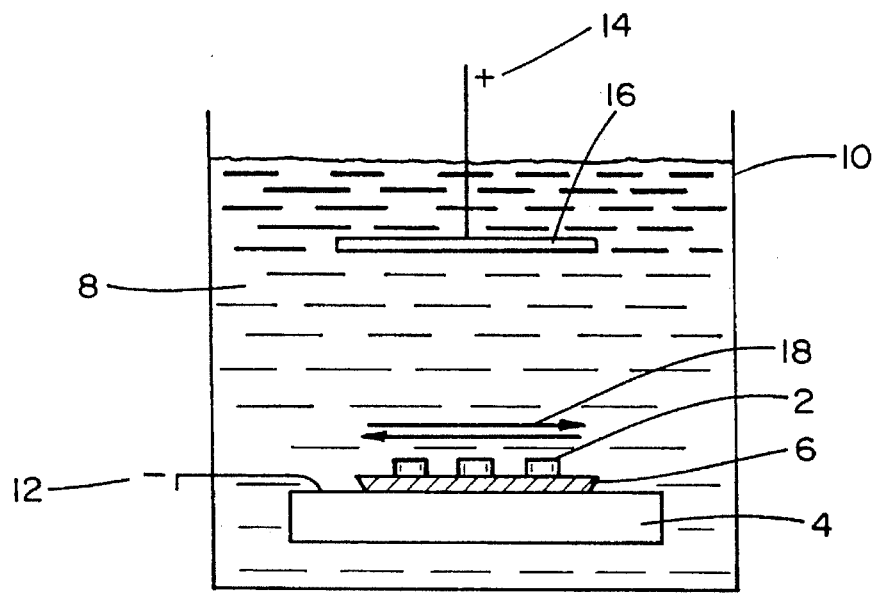
FIG. 1 illustrates the metallization process in accordance with the present invention which employs a conventional paddle cell as the plating cell.

The present invention is directed to a novel and simple method for the fabrication of multiple via chip testing vehicles which consist of a polymer body with metallized thru-holes linking the bottom and top sides of the structures. The method of metallizing the thru-holes in said multiple via chip testing vehicle in accordance with the present invention can also be used in the metallization of thru-holes in multiple polyimide structures used for mounting and interconnecting electronic system components.

The initial step in the manufacturing of testing vehicles is the selection of the polymer material to be used as the polymer body of the vehicle. It is also necessary to make a decision as to whether the testing vehicle is going to be a single or multi-layered vehicle. In choosing the proper polymer material, it is important to keep in mind the need to maintain a low dielectric constant and a high temperature resistance. It is also critical to choose a material which will enable layer thicknesses in the range of from between about 50 to about 600 micrometers.

The preferred materials which meet the above-identified criteria are polyimides, such as Kapton® (the polyimide from ODA (4,4'-diaminodiphenyl ether)-PMDA (pyromellitic dianhydride)), Upilex® (polyimide films made from BPDA (3,3', 4,4'-biphenyltetracarboxylic dianhydride) and Vespel® (a polyimide moulding material having the ODA-PMDA structure), or polymers such as liquid crystalline polyesters, polyether ketones, polyphenylene sulfide, Teflon® and polyetherimide. Although these represent the preferred polymer materials to be used in the practice of the present invention, any conventional polymer material meeting the required characteristics can be used.

Once the polymer material is selected, the next step is via or thru-hole generation. This can be accomplished by any of the conventionally known techniques of thru-hole generation and includes mechanical drilling, laser drilling and mechanical punching. Mechanical drilling is the preferred method in the practice of the present invention for the formation of thru-holes having as small as 75 to 100 μm diameters. For thru-hole generation in very thin layers, laser drilling may be used. However, it should be noted that laser drilling-can leave unwanted conducting carbonaceous residues on the polymer structure and thru-hole surfaces which will interfere with the metallization process. Mechanical punching has the disadvantage of leaving unwanted strained and torn or cracked regions in the polymer structures and protruding rims at the punch exit sites. A typical density of vias in a test vehicle is from about 1900 to about 2500 per square cm. The hole diameter can be as small as 75 micrometers while the body thickness can vary between from about 50 to about 600 micrometers.

The third and most crucial step in the manufacturing of the testing vehicle is the metallization of the thru-holes, the process to which the present invention is specifically directed. Unique over the prior art techniques, the process of metallizing the thru-holes in accordance with the present invention does not use seeding or photoprocessing steps and avoids the need for via surface personalization, i.e. the present invention does not require the use of photoresist masks to selectively isolate the vias from one another.

The key component to the method for the full metallization of thru-holes in a polymer structure in accordance with the present invention is the use of a "temporary removable cathode", or more specifically, a "removable polymer composite cathode" which acts as a temporary cathode of a plating system. When the plating operation is completed, the polymer composite temporary cathode is removed. More specifically, the present invention is directed to a process for the metallization of thru-holes in a polymer structure comprising the steps of applying a film-forming amount of a conductive polymer-metal composite paste to a metal cathode, bonding a patterned polymer structure to the paste, subjecting the polymer structure to an electrolytic plating bath for a time sufficient to fully metallize the thru-hole surfaces in the patterned polymer structure, removing the fully metallized polymer structure from the bath and cleaning and polishing the structure. The film-forming amount of the conductive polymer-metal composite paste is the temporary removable cathode.

The temporary removable cathode, and more specifically, the film-forming conductive polymer-metal composite paste, should meet a number of specific requirements, namely, it should be highly conductive, inert to the plating solution, easily removable with solvents, heat or by pulling apart after the plating operation is completed and be able to form an extremely small film thickness of from about 10 to about 30 micrometers, preferably from about 10 to about 20 micrometers. The small film thickness is necessary in order to provide enough material to achieve good bonding between the polymer structure and the metal cathode while at the same time preventing the paste from oozing into and occupying the thru-holes. Accordingly, the polymer component of the conductive paste is preferably a thermoplastic material such as polyimide-siloxane type polymers and copolymers, polysulfones and the like. Other thermoplastic materials can be used if certain requirements are met, namely, a high conductivity of the resulting paste and compatibility with the plating bath which is to be used. The metal component generally is chosen from silver, gold, nickel and palladium, with silver or gold powder being preferred. Thus, examples of the conductive polymer-metal paste to be used in the practice of the invention include silver or gold powder dispersed in polyimide siloxane conductive paste or polysulfones. Because the paste is applied to the metal cathode in the first step of the metallization process according to the present invention, the paste is referred to for purposes of the present invention as the "temporary cathode paste" or the "temporary removable cathode." The working metal cathode is a solid, flat metal piece chosen from copper, stainless steel and other metals, including graphite, having a highly polished metal surface.

The second step in the metallization process in accordance with the present invention is the bonding of a patterned polymer structure to the temporary cathode paste which is now atop the working cathode. The bonding step is achieved in a two-step process. The initial step, prior to the actual bonding of the polymer structure to the temporary cathode paste, involves the removing of solvent from the paste by drying the cathode, at room temperature for a period of about 4 to about 8 hours or, alternatively, for a period of 1 hour at a temperature of from about 80° to about 100° C.

After removing the solvent from the paste, the second step of the bonding process is the actual attaching of the polymer structure to the paste by the application of pressure and heat to the polymer structure in order to insure planarity of the structure and that all thru-holes will plate evenly. This "baking" of the cathode combined with applied pressure to the polymer structure achieves a sufficient bonding of the patterned polymer to the temporary cathode paste.

Figure 2:
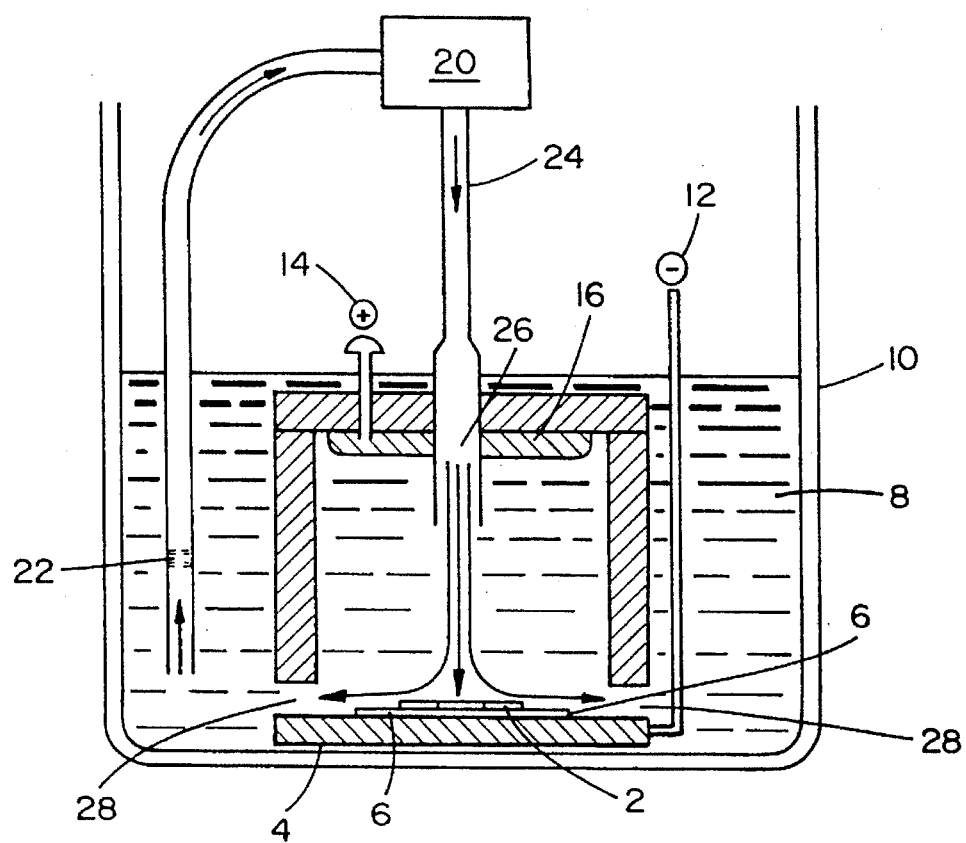
FIG. 2 illustrates the metallization process in accordance with the present invention which employs a jet cell as the plating cell.

The third step in the metallization process is the plating operation with the use of a plating cell. This step can be accomplished by using a conventional paddle cell as shown in FIG. 1 or it can be achieved with the use of a jet cell as illustrated in FIG. 2.

As noted above, FIG. 1 illustrates the use of a conventional horizontal paddle cell in the plating operation of the metallization process of the present invention. With specific reference to FIG. 1, the patterned polymer structure or one or more testing vehicles (2) are attached to a working metal cathode (4) using a removable temporary cathode paste (6). A plating solution (8) is retained in a container means (10) in which said polymer structure (2) and working cathode (4) are completely submerged. A power supply means (not shown) comprises a negative terminal (12) connected to the working metal cathode (4) and a positive terminal (14) connected to an anode (16), said anode (16) being positioned in the plating solution (8) directly over the polymer structure or testing vehicle(s) (2). The paddle cell as described above, which further includes a moving paddle as means (18) for stirring the plating solution, is conventionally operated for a time sufficient to fully metallize the thru-holes of the polymer structure or testing vehicle(s) (2).

Figure 3:
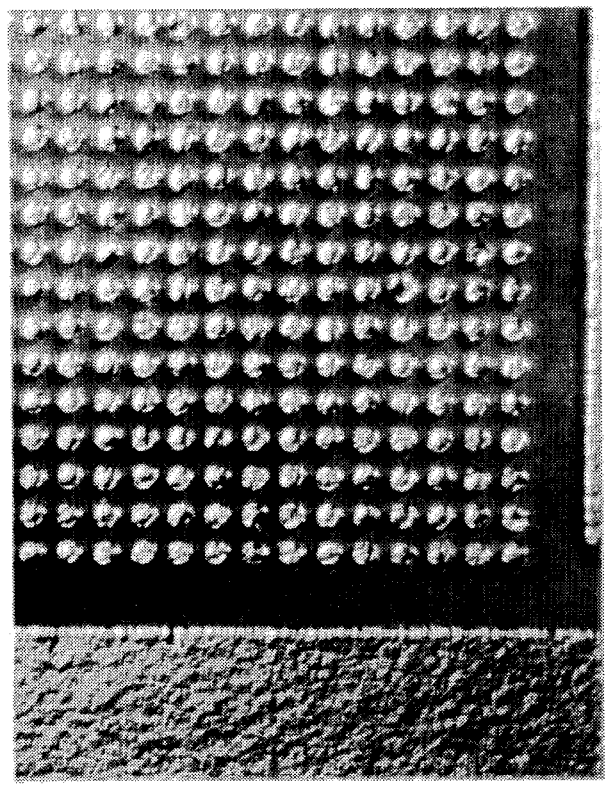
FIG. 3 is a top view photograph of a fully metallized, 5 mil thick Upilex-S® (the polyimide from PPD (p-phenylenediamine)-BPDA (3,3',4,4'-biphenyltetracarboxylic dianhydride)) layer containing an array of 47×47, 4 mil diameter holes on 8 mil center to center spacing, prepared by the method of the present invention.

FIG. 3 is a top view photograph of a polymer structure with thru-holes which have been fully metallized by the method in accordance with the present invention. More particularly, the photograph is of a fully metallized, 127 µm thick Upilex-S® (the polyimide from PPD-BPDA) layer, containing an array of 47×47, 100 µm diameter holes, on 200 µm center to center spacing. The sample was prepared in a paddle cell, in accordance with the conditions described in Example 1 below. The photograph was taken before the final polishing step.

Figure 4:
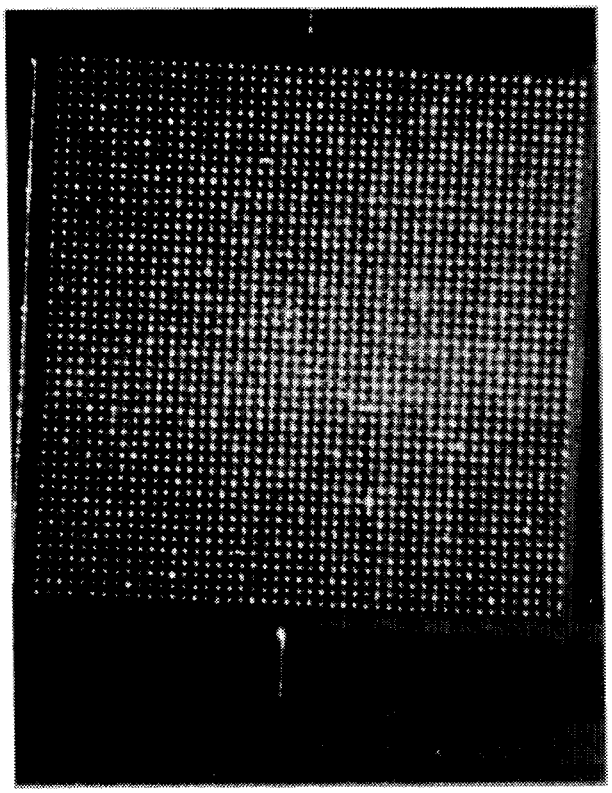
FIG. 4 is an enlarged view of a section of the photograph shown in FIG. 3 and illustrates the detailed uniformity of the plated copper bumps protruding from the vias metallized in accordance with the present invention.

An enlarged view of a section of the sample shown in FIG. 3 is shown in FIG. 4 and illustrates the detailed uniformity of the plated copper bumps protruding from the metallized thru-holes.

Alternatively, as shown in FIG. 2, a jet cell may be used in the plating operation of the metallization process of the present invention. Similar to the paddle cell, the jet cell comprises a container means (10) which retains a plating solution (8). Submerged in said plating solution (8) is a permanent working cathode (4) to which a patterned polymer structure or testing vehicle(s) (2) is attached by the use of a removable temporary cathode paste (6). Also similar to the paddle cell, the jet cell includes a power supply means (not shown) comprising a negative terminal (12) which is connected to the working metal cathode (4) and a positive titanium terminal (14) connected to an anode (16) which is also submerged in the plating solution (8) and which is positioned directly over the polymer structure or testing vehicle(s) (2). The jet cell, however, differs from the paddle cell shown in FIG. 1 in that it further comprises a pump (20) which supplies the plating solution (8), via a filter (22) positioned in the container means (10), to a tube (24) which runs through a control orifice (26) in the anode (16). The plating solution (8) is impinged directly on the polymer structure or testing vehicle(s) (2) to be plated and escapes the cell through a narrow (1–2 mm) gap (28), back into the surrounding container means (10).

Plating current density is generally in the range of from about 10 to about 30 $mA/cm^2$. The anode and cathode are of roughly the same surface area and are oriented parallel and opposite each other, at a distance of at least about 2 cm. The jet flow rate is at least about 150 to about 200 $ml/min/cm^2$ onto-the cathode. If multiple structures are to be plated simultaneously, the jet should be split through a multiple nozzle so that it impinges equally on each structure.

Following the plating operation, the temporary cathode paste is removed from the metal cathode. This may be accomplished by the use of solvents such as xylene or mixtures of xylene with acetophenone or dimethyl adipate or other moderately polar solvents. Other aromatic hydrocarbons, such as toluene, can replace xylene. Optionally, the polymer structure may also be thermally removed, i.e. by softening the paste polymer. This can be accomplished by heating the metal cathode on a hot plate in $N_2$ to a temperature of typically about 200° to about 250° C., at which point the polymer in the temporary cathode paste softens and the polymer structure can be removed mechanically.

Finally, once the thermal paste has been removed form the metal cathode, the polymer structure or testing vehicle(s) with fully metallized thru-holes can be cleaned and polished on both sides to result in a finished product. The polishing serves to consecutively remove any cathode paste remains from the bottom side of the polymer structure and overplated excess copper from the top side of the polymer structure, together with a small fraction of the structure's thickness, i.e. typically less than about 10 µm. The polishing material of choice is a fine alumina and colloidal silica slurry. However, any conventional polishing material can be used.

If desired, electroless gold can be applied to the surface of each plated thru-hole in order that tarnishing is prevented. Said application of gold consequently decreases contact resistance as well. The application of electroless gold to the surfaces of the plated thru-holes can be accomplished by any known conventional means.

The following examples are provided to further illustrate the present invention.

EXAMPLE 1

On a 12.7×12.7 cm square flat copper cathode, a conductive paste made of polyimide-siloxane copolymer, 1–5 µm silver powder (weight ratio 13 parts copolymer: 87 parts silver), and a 2:1 acetophenone-xylene solvent mixture was doctor-bladed between 38 μm steel shims to form stripes about 2 cm wide. The paste was air-dried for 4 hrs. Separately, 6 testing vehicles made of flat 127 μm thick Upliex-S® (the polyimide from PPD-BPDA) sheet were prepared by drilling in each a square array of 47×47 thru-holes, 100 μm in diameter and 200 μm center-to-center. The test vehicles cut out of the Upilex® sheet as squares of 1.1 to 1.2 cm with small holding tags attached, were symmetrically positioned on the paste-covered areas of the cathode. A flat glass plate followed by steel weights preheated to 140° C. were put on top of the test vehicles to generate an average pressure of ca. 1.5 kg/cm$^2$. The assembly was put in an oven preheated to 200° C., nitrogen flow was started, and the assembly was heated over a period of approximately 2 hrs until the lower steel weight reached 200° C.; then power was turned off and the assembly was allowed to cool slowly to ca. 100° C. under pressure, then was taken out.

The cathode assembly was plated in an horizontal paddle cell filled with SEL-REX CUBATH M® copper sulfate/sulfuric acid solution. The cathode assembly included a "thief" metal frame, to equalize surface areas of the cathode and anode and ensure uniform plating. A phosphorized copper anode plate was used. Anode to cathode distance was 10 cm; paddle to workpiece distance was 3 mm, and paddling frequency was 1 Hz. Plating was at 30 mA/cm$^2$ for both assembly and "thief" and was continued for 170 min. Testing vehicles were then examined under a microscope and with a Dektak profilometer, to make sure that copper had plated through all vias and emerged through their tops. This was the case.

The cathode assembly was then immersed in xylene for 2 hrs, after which the test vehicles were able to be removed easily. Remaining paste on the bottom side was mostly removed by rubbing against an N-methylpyrrolidinone-soaked hardened filter paper. The excess copper on top and excess paste on bottom were removed by polishing on a Strasbaugh 6AC polisher, with a slurry made of deionized water, NALCO-2360 colloidal silica and 0.05 μm fine alumina, then rinsing and examining the samples to make sure that uniformly flat surfaces with no copper smear were obtained. Finally, the test vehicles were plated for 15 min in an electroless gold exchange bath, to form a protective gold layer of ca. 0.5 μm.

EXAMPLE 2

A test vehicle was prepared out of a Kapton® (the polyimide from ODA-PMDA) 127 μm thick sheet, by punching a 27×27 square array of thru-holes, 127 μm in diameter and 227 μm center-to-center. It was bonded to the center of a 2.5×2.5 cm "thief" steel cathode by means of the paste described in Example 1 and by the same method. The cathode was placed at the bottom of a jet cell having inner dimensions 2.5×2.5×3.5 cm. Opposite the cathode, down the 3.5 cm length of the cell axis, two Ti bolts suspended a 2.5×2.5×0.5 cm copper-phosphorus anode from the top of the cell. A polypropylene nozzle was threaded through the anode, pointing down the cell axis, and connected to a peristaltic pump. The cell was immersed in a 300 ml reserve of SEL-REX CUBATH M® copper sulfate-sulfuric acid bath; the pump drove 1 liter/min. of solution from the reserve into the polarizable region of the cell, pointing at the test vehicle; the solution left the cell through the gap surrounding the cathode. Plating for 6 hrs. at 20 A/cm$^2$ produced a 150 μm thickness of copper. The test vehicle was rinsed in deionized water and planarized by abrasion on a resin-bonded 6 μm diamond lap with water as lubricant; then it was removed from the steel cathode as in Example 1. The thru-holes of the test vehicle had been fully metallized.

EXAMPLE 3

A test vehicle was prepared as described in Example 1, except that the polymer used in the conductive paste was polysulfone (Amoco's Udel® P-1800), the bonding was performed by heating from 180° to 300° C. over a period of 3 hrs, and the solvent used to facilitate the test vehicle removal from the cathode was a mixture of xylene and dimethyl adipate. Again, the resulting test vehicle had fully metallized thru-holes.

EXAMPLE 4

A test vehicle was prepared as described in Example 2, except that the test vehicle was prepared by drilling a 27×27 square array of thru-holes, 127 μm in diameter and 229 μm center-to-center, into a Vespel (the polyimide moulding material having the ODA-PMDA structure) sheet, 508 μm thick. In addition, plating was performed at 20 mA/cm$^2$ for 26 hours to obtain fully plated copper vias. The copper solution in the reservoir was replaced with fresh solution after the first 15 hours.

While the invention has been particularly shown and described with respect to a preferred embodiment thereof, it will be understood by those skilled in the art that the foregoing and other changes in form and details may be made therein without departing from the spirit and scope of the invention.

Having thus described our invention, what we claim as new, and desire to secure by Letters patent is:

1. A method for fully metallizing thru-holes in a patterned polymer structure comprising the steps of:

(a) applying a temporary removable cathode to a metal cathode to form a cathode assembly;

(b) bonding said patterned polymer structure to said temporary removable cathode;

(c) subjecting said patterned polymer structure to an electrolytic plating bath for a time sufficient to fully metallize thru-hole surfaces in said patterned polymer structure;

(d) removing said patterned polymer structure from said electrolytic plating bath; and (e) removing said patterned polymer structure from said cathode assembly.

2. The method according to claim 1 wherein said temporary removable cathode is a film-forming conductive polymer-metal composite paste.

3. The method according to claim 2 wherein said polymer in said polymer-metal composite paste is a thermoplastic material.

4. The method according to claim 3 wherein said thermoplastic material is a polymide-siloxane polymer or copolymer.

5. The method according to claim 3 wherein said thermoplastic material is a polysulfone.

6. The method according to claim 2 wherein said metal in said conductive polymer-metal composite paste is silver.

7. The method according to claim 2 wherein said metal in said conductive polymer-metal composite paste is gold.

8. The method according to claim 2 wherein said metal in said conductive polymer-metal composite paste is nickel.

9. The method according to claim 2 wherein said metal in said conductive polymer-metal composite paste is palladium., 10. The method according to claim 2 wherein said conductive polymer-metal composite paste is silver powder dispersed in polyimide siloxane conductive paste.

11. The method according to claim 2 wherein said conductive polymer-metal composite paste is gold powder dispersed in polyimide siloxane conductive paste.

12. The method according to claim 2 wherein said conductive polymer-metal composite paste is silver powder dispersed in polysulfone conductive paste.

13. The method according to claim 2 wherein said conductive polymer-metal composite paste is gold powder dispersed in polysulfone conductive paste.

14. The method according to claim 1 wherein said metal cathode is made of copper.

15. The method according to claim 1 wherein said metal cathode is made of stainless steel.

16. The method according to claim 1 wherein said metal cathode is made of graphite.

17. The method according to claim 2 wherein said conductive polymer-metal composite paste is dried to bond the patterned polymer structure thereto.

18. The method according to claim 17 wherein said drying of said conductive polymer-metal composite paste removes solvent from said paste.

19. The method according to claim 17 wherein said conductive polymer-metal composite paste is dried at room temperature for a period of about 4 to about 8 hours.

20. The method according to claim 17 wherein said conductive polymer-metal composite paste is dried at a temperature of from about 80° to about 100° C. for a period of about 1 hour.

21. The method according to claim 17 further comprising the step of applying pressure and heat to said polymer structure to achieve bonding of said polymer structure to said paste.

22. The method according to claim 1 wherein said plating bath is in the form of a paddle cell.

23. The method according to claim 1 wherein said plating bath is in the form of a jet cell.

24. The method according to claim 1 wherein said plating bath contains a copper plating solution.

25. The method according to claim 24 wherein said copper plating solution is an acid copper plating solution.

26. The method according to claim 1 wherein said temporary removable cathode is removed from said metal cathode with the use of a solvent.

27. The method according to claim 26 wherein said solvent is an aromatic hydrocarbon.

28. The method according to claim 27 wherein said aromatic hydrocarbon is mixed with a polar solvent.

29. The method according to claim 27 wherein said aromatic hydrocarbon is xylene.

30. The method according to claim 27 wherein said aromatic hydrocarbon is toluene.

31. The method according to claim 28 wherein said polar solvent is acetophenone.

32. The method according to claim 28 wherein said polar solvent is dimethyl adipate.

33. The method according to claim 1 wherein said temporary removable cathode is thermally removed from said metal cathode.

34. The method according to claim 1 which further comprises the step of polishing said metallized polymer structure.

35. The method according to claim 34 wherein said metallized polymer structure is polished using a fine alumina and colloidal silica slurry.

36. The method according to claim 1 which further comprises the step of applying electroless gold to surfaces of thru-holes in said polymer structure.

37. The method according to claim 1 wherein said polymer in said polymer structure is a polyimide.

38. The method according to claim 37 wherein said polyimide is a polyimide made from ODA (4,4'-diaminodiphenyl ether)-PMDA (pyromellitic dianhydride).

39. The method according to claim 37 wherein said polyimide is a polyimide made from PPD (p-phenylenediamine)-BPDA (3,3'4,4'-biphenyltetracarboxylix dianhydride).

40. The method according to claim 37 wherein said polyimide is a polyimide moulding material having the ODA (4,4'-diaminodiphenyl ether)-PMDA (pyromellitic dianhydride) structure.

41. The method according to claim 1 wherein said polymer in said polymer structure is a liquid crystalline polyester.

42. The method according to claim 1 wherein said polymer in said polymer structure is a polyether ketone.

43. The method according to claim 1 wherein said polymer in said polymer structure is a polyphenylene sulfide.

44. The method according to claim 1 wherein said polymer in said polymer structure is Teflon.

45. The method according to claim 1 wherein said polymer in said polymer structure is polyetherimide.

46. The method according to claim 1 wherein said polymer structure is a multiple via chip testing vehicle.

47. The method according to claim 1 wherein said polymer structure is a multiple polyimide structure.

* * * * *